(12) United States Patent
Jain (10) Patent No.: US 7,868,677 B2
(45) Date of Patent: Jan. 11, 2011

(54) LOW POWER FLIP-FLOP CIRCUIT

(75) Inventor: Abhishek Jain, Delhi (IN)

(73) Assignee: STMicroelectronics Pvt. Ltd., Greater Noida (IN)

(*) Notice: Subject to any disclaimer, the term of this patent is extended or adjusted under 35 U.S.C. 154(b) by 54 days.

(21) Appl. No.: 11/965,580

(22) Filed: Dec. 27, 2007

(65) Prior Publication Data

US 2008/0218234 A1 Sep. 11, 2008

(30) Foreign Application Priority Data

Dec. 28, 2006 (IN) .................. 2819/DEL/2006

(51) Int. Cl.
*H03K 3/289* (2006.01)

(52) U.S. Cl. .................. 327/202; 327/203; 327/208

(58) Field of Classification Search ......... 327/199–203, 327/208, 212, 214
See application file for complete search history.

(56) References Cited

U.S. PATENT DOCUMENTS

| | | | |
|---|---|---|---|
| 4,424,460 A * | 1/1984 | Best ........................... | 326/55 |
| 6,803,799 B1 * | 10/2004 | Churchill et al. ............ | 327/202 |
| 6,998,896 B1 * | 2/2006 | De La Cruz et al. ......... | 327/202 |
| 7,427,875 B2 * | 9/2008 | Kim et al. ..................... | 326/46 |
| 7,518,426 B1 * | 4/2009 | Smith ........................... | 327/199 |

* cited by examiner

*Primary Examiner*—Hai L Nguyen
(74) *Attorney, Agent, or Firm*—Lisa K. Jorgenson; Allen, Dyer, Doppelt, Milbrath & Gilchrist, P.A.

(57) ABSTRACT

A flip-flop circuit having low power consumption includes a sensing circuit, and a clock generating circuit. The flip-flop is leading edge triggered and operates on an internally generated pseudo clock signal. The sensing circuit senses a change in an input signal and an output signal of the flip-flop. The clock generating circuit generates a pseudo clock signal with a sharp rise and fall based upon an external clock signal.

25 Claims, 13 Drawing Sheets

FIG. 1

(PRIOR ART)

(PRIOR ART)

LOW POWER FLIP-FLOP CIRCUIT

FIELD OF THE INVENTION

The present invention relates to sequential digital circuits and more specifically to a low power flip-flop circuit, which can be utilized in low electromagnetic interference applications.

BACKGROUND OF THE INVENTION

In various digital circuits, flip-flops are the fundamental sequential logic element. Power dissipated or consumed in the flip-flops makes up a significant portion of the total power dissipation in a circuit design. Thus, by reducing power dissipation in the flip-flops, the performance of the design can be improved drastically. Also, in digital designs, comprising millions of flip-flops and clock tree buffers, there is a high amount of switching current during dynamic transitions. The current in clock tree buffers cannot be controlled, but we can lower the switching current in the flip-flops to lower the electromagnetic emissions.

Figure 1:
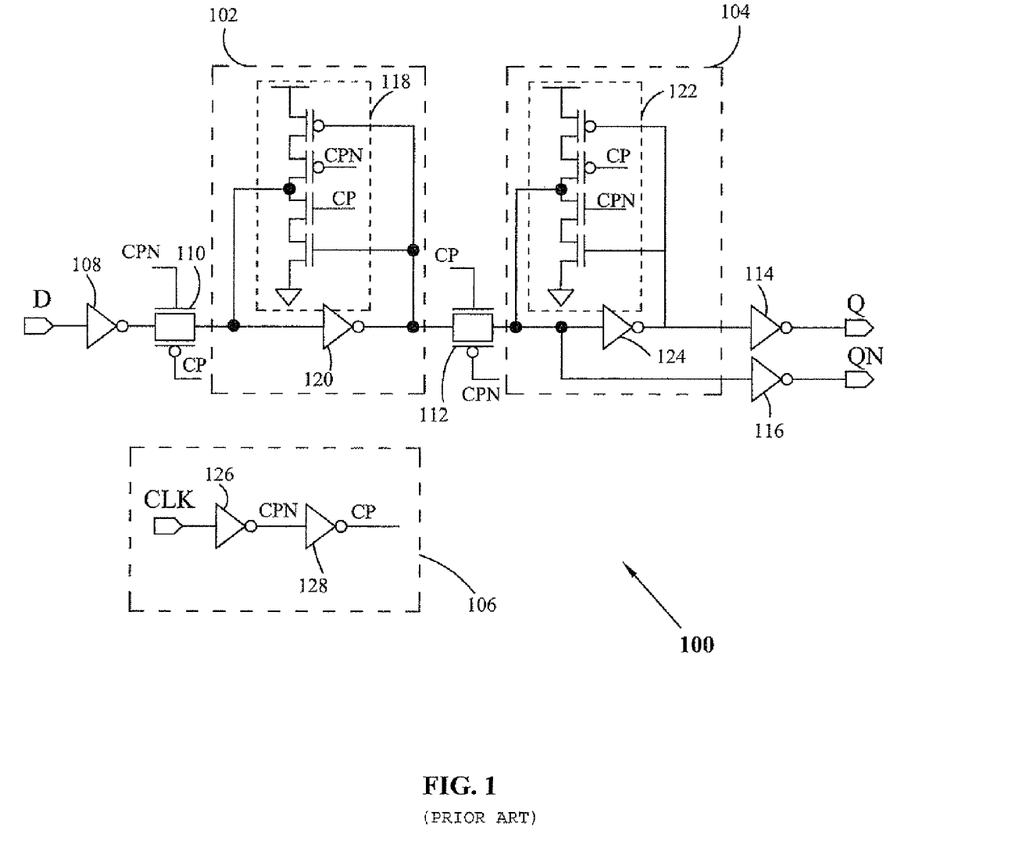
FIG. 1 is a circuit diagram of a conventional flip-flop circuit, in accordance with the prior art.

FIG. 1 illustrates a conventional flip-flop circuit 100. The flip-flop circuit 100 includes a master latch 102, a slave latch 104, a clock buffer 106, an inverter 108, transmission gates 110 and 112 and inverters 114 and 116. The master latch 102 includes a tri-state inverter 118 and an inverter 120. The slave latch 104 includes a tri-state inverter 122 and an inverter 124. The tri-state inverters 118 and 122 include a pair of PMOS transistors and a pair of NMOS transistors. The connection of the master latch 102 and the slave latch 104 is as shown in FIG. 1. The clock buffer 106 includes a pair of inverters 126 and 128. The transmission gates 110 and 112 include an NMOS transistor and a PMOS transistor.

When the clock is low, the master latch 102 becomes transparent, i.e., the transmission gate 110 at an input D turns ON to transfer data D. The slave latch 104 restores the previous flip-flop output by enabling the tri-state inverter 122 in the feedback path and the rest of the circuit is inactive. When the clock is high, the slave latch 104 becomes transparent through the transmission gate 112. The data at the output of inverter 120 gets transferred to an output Q through the transmission gate 112, and the inverters 124 and 114. The data gets transferred to an output QN through the transmission gate 112 and the inverter 116. In the master latch 102, the feedback tri-state inverter 118 is ON, restoring the previous data. The clock buffer circuit 106 includes two inverters 126 and 128 whose output gives two 180 degree shifted clocks on which the master latch 102 and the slave latch 104 operate. The inverter 126 is mainly introduced to achieve clock slope independency; such that on different clock cycles the flip-flop slope characteristics do not change much.

The flip-flop operation can be divided into three states. State I—clock constant data toggle, state II—data constant clock toggle and state III—clock change flip-flop output (Q) change. In state I, depending on the clock state (high or low), the power dissipation is less or more (respectively) and is governed by data switching only. When in the data constant clock toggle state, i.e., state II, due to clock switching (on the order of MHz), a lot of power gets dissipated in the clock buffer circuit 106 as well as in the master latch 102 and in the slave latch 104. In state III, the clock flip-flop output Q changes state, there is power dissipation that cannot be avoided. Data activity in most digital designs is small compared to the clock activity. Therefore, it is desired to reduce the power dissipation in the case of data constant clock toggling (i.e., state II). Already some work has been done in this field in order to reduce the power dissipation.

Figure 2:
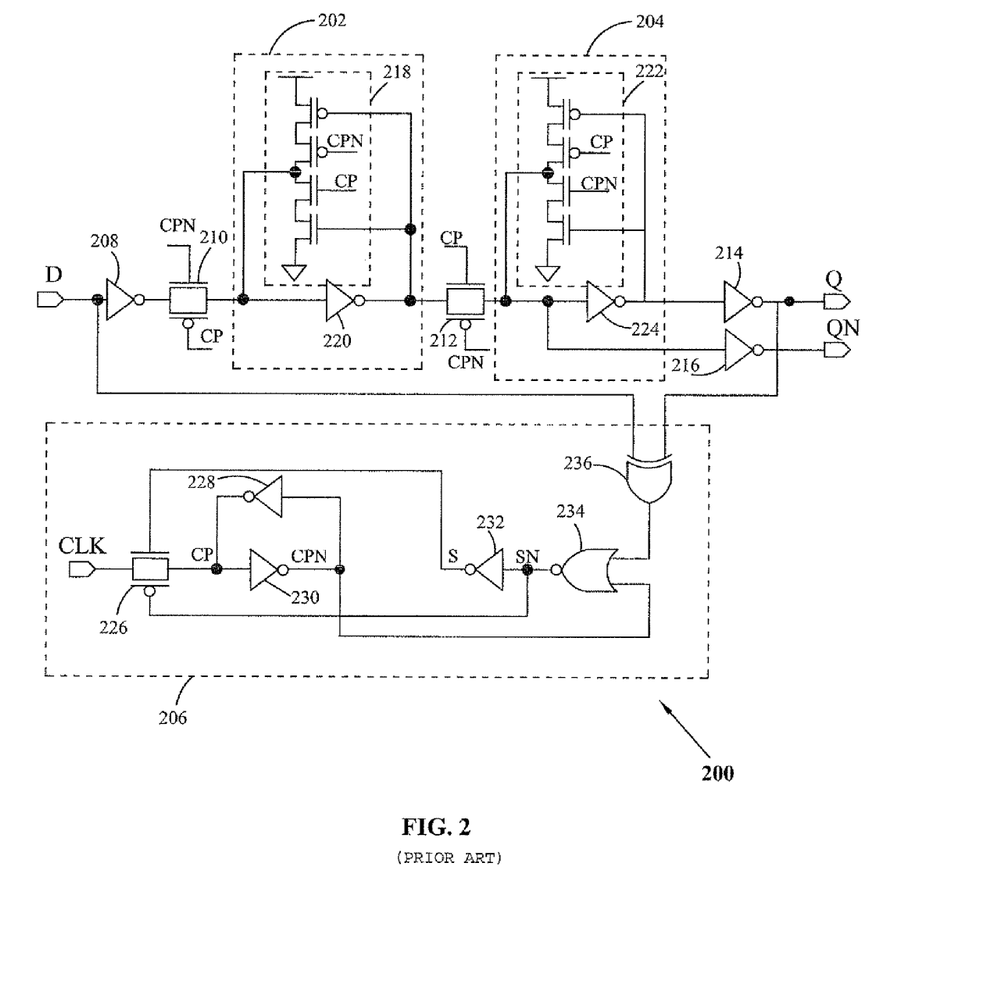
FIG. 2 is a circuit diagram of another flip-flop circuit, in accordance with the prior art.

FIG. 2 illustrates a conventional low power flip-flop circuit 200, which reduces power dissipation in a State II mode. The circuit 200 comprises the conventional flip-flop circuit 100 as illustrated in FIG. 1 and an internal clock generating circuit 206. The clock generating circuit 206 comprises a transmission gate 226, multiple inverters such as 228, 230, 232 and a sensing circuit, which is a two input XOR gate 236 and a NOR gate 234.

The flip-flop output Q and the data input D is fed to the XOR gate 236. The output of the XOR gate 236 is connected to an input of the NOR gate 234. The NOR gate 234 has its other input connected to a signal CPN and the output is a control signal S. The control signals S and SN control the transfer of an external clock CLK to an internal clock CP through the transmission gate 226. The output of the transmission gate 226 is supplied to two back-to-back connected inverters 228 and 230. The inverters 228 and 230 hold the clock value when the transmission gate 226 is disabled and also provide two phase clock signals CPN and CP upon which the flip-flop operates.

Figure 4:
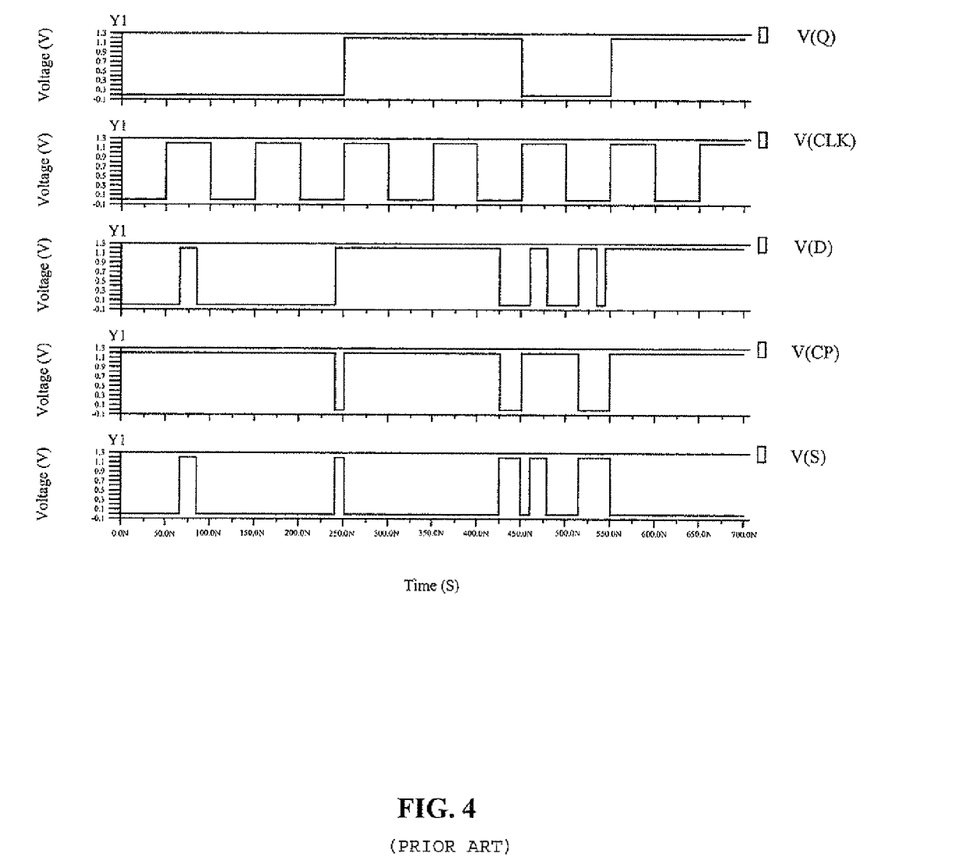
FIG. 4 is a graph describing the functionality of the flip-flop structure of FIG. 2 of the prior art.
Figure 5:
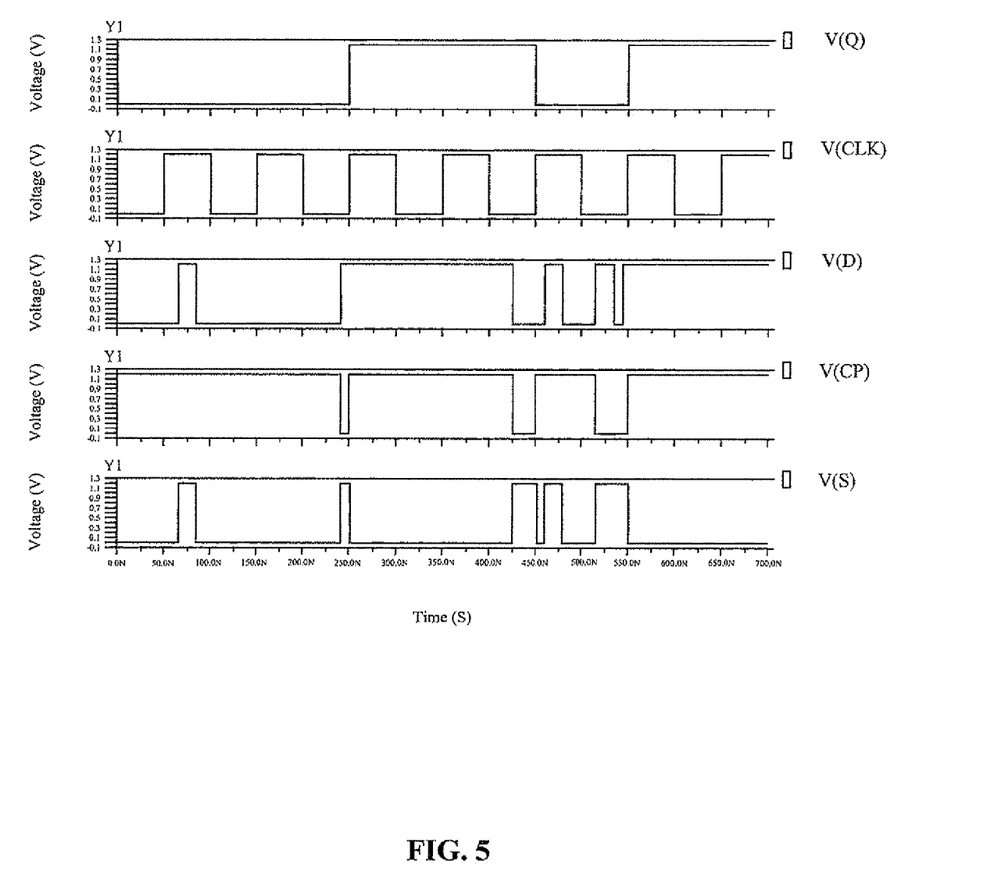
FIG. 5 is a graph describing the functionality of the flip-flop structure of FIG. 3.

FIG. 4 illustrates the functionality of the flip-flop circuit 200. When D and Q are same, S is low and when D and Q are different, S is high. When S is high the transmission gate 226 is ON and the clock signal is passed to a node CP. When S is low, the transmission gate 226 is OFF and the previous value at the transmission gate 226 is restored at the node CP. However, when S is high, the transmission gate 226 is ON and the CLK signal makes a transition from 0 to 1. Then, at the node CP, the inverter 228 opposes the transition. The inverter 228 tries to drive the node CP to 0, whereas, through the transmission gate 226, the CLK tries to drive it to 1, resulting in a contention at the node CP. This results in high power dissipation and an imperfect rise at the node CP.

Figure 6:
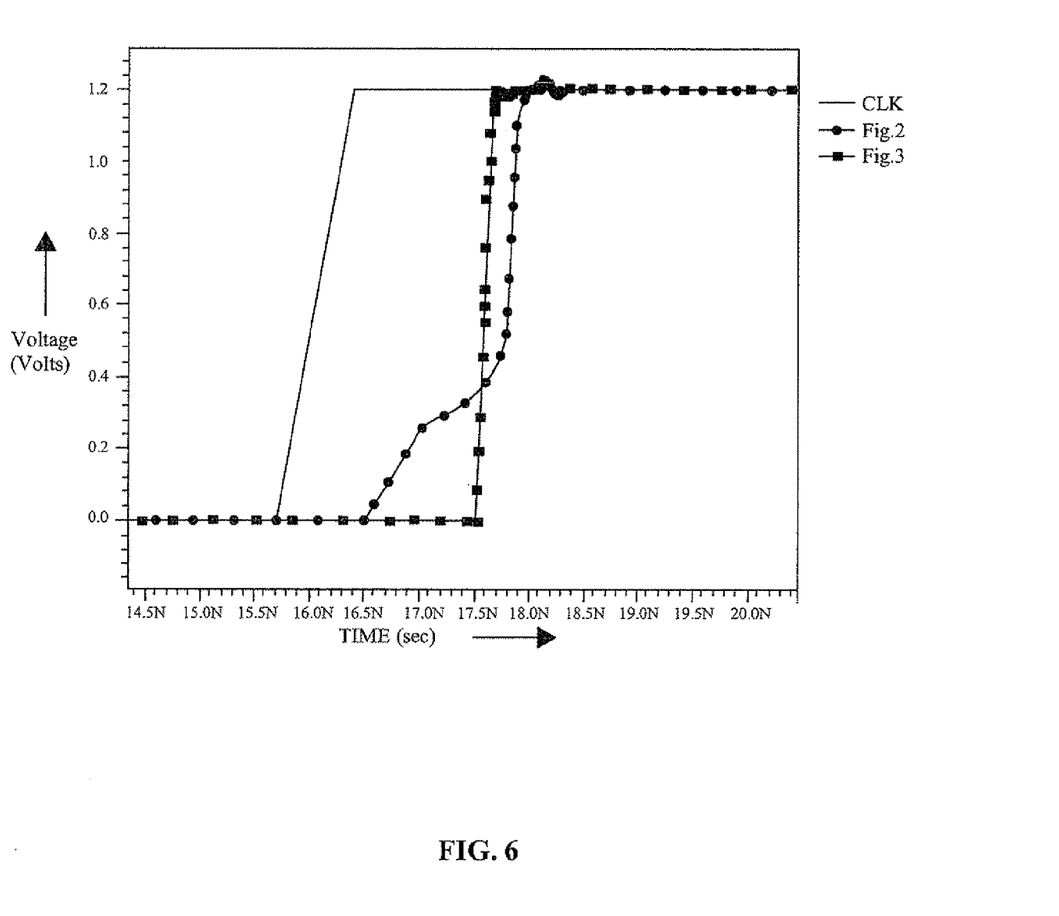
FIG. 6 shows the respective internal clock signals of the flip-flops of FIG. 2 and FIG. 3.

FIG. 6 illustrates the internal clock signals of flip-flop circuits 200 and 300. For the flip-flop circuit 200, the internally generated clock signal CP has a very poor rise. First, the clock rises to an intermediate voltage value sharply, stays there for some time, and then rises to a value VDD. Since the CP signal drives the master and slave of the flip-flop circuit, the poor nature of the signal degrades the delay, the setup time, the hold time, and the power dissipation associated with the flip-flop circuit. The structure is very sensitive to input clock slope. With an increase in input clock slope, the rise time of the internal CP signal also increases, and, it stays at intermediate value for extra time resulting in higher power dissipation, delay, and setup-hold. There is also a risk of functionality failure in this structure. If in manufacturing, due to a slight variation in doping levels, the NMOS becomes faster than the PMOS, the node CP may not be able to rise due to the inverter 228 NMOS pulling the node CP down to 0. As a result, the internal CP signal will always remain at 0 and no external data will be latched. The sizing of transistors is very critical in the above flip-flop, as the transmission gate 226 has to be made very strong to drive the node CP, and the inverter 228 has to be made weak. The area of the flip-flop also increases, to make the transistor strong, and its gate width should also be increased. In order to weaken the transistor, its gate length should be increased. Hence, the flip-flop circuit 200 is not suitable, especially for ultra deep sub-micrometer (DSM) technologies, where mismatches because of the technology are high.

Therefore, there is a need for a novel flip-flop circuit capable of providing low power for low electromagnetic interference (EMI) applications.

SUMMARY OF THE INVENTION

It is an object of the present invention to provide a low power flip-flop circuit for low electromagnetic interference (EMI) applications. To achieve the aforementioned objective, the present embodiment provides a low power flip-flop circuit comprising a flip-flop circuit for receiving and holding an input signal in response to an internal clock, a sensing circuit operatively coupled to the flip-flop circuit for comparing the input signal with an output signal of the flip-flop circuit to provide a comparison signal, and a clock generating circuit receiving an external clock signal and being operatively coupled to the sensing circuit for generating a pseudo clock signal under control of the comparison signal. The pseudo clock may follow a positive edge of the external clock signal and reduce power dissipation or consumption.

Furthermore, an embodiment provides a low power flip-flop circuit comprising a flip-flop circuit for receiving and holding an input signal in response to an internal clock and a sensing circuit operatively coupled to the flip-flop circuit for comparing the input signal with an output signal of the flip-flop circuit to provide a comparison signal. The sensing circuit may comprise a first transmission gate connected in parallel to a second transmission gate for providing the comparison signal. A clock generating circuit may be operatively coupled to the sensing circuit for generating a pseudo clock signal under control of the comparison signal. The clock generating circuit may receive an external clock signal and comprise a tri-state latch circuit receiving the external clock signal for generating the pseudo clock signal under control of the comparison signal, a pair of NMOS transistors connected in series for maintaining the pseudo clock signal and preventing a false edge generation. Furthermore, the clock generating circuit includes an inverter circuit for inverting the pseudo clock signal and a NAND gate operatively coupled to the sensing circuit and the clock generating circuit for controlling the comparison signal and to prevent a false edge generation.

Another embodiment provides a method for providing low power dissipation in a flip-flop circuit. The method may comprise receiving an input signal through an input node of the flip-flop circuit and comparing the input signal with an output signal for providing a comparison signal through a sensing circuit. Additionally, the method may include generating a pseudo clock signal under control of the comparison signal through a clock generating circuit, holding the input signal in response to an internal clock to generate the output signal with a delay, and controlling the comparison signal for preventing a false edge generation and to prevent power dissipations in the flip-flop circuit.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF THE PREFERRED EMBODIMENTS

The preferred embodiments of the present invention will be described in detail with reference to the accompanying drawings. However, the present invention is not limited to the preferred embodiments. The present invention can be modified in various forms. The preferred embodiments of the present invention are only provided to explain more clearly the present invention to one of ordinary skill in the art of the present invention. In the accompanying drawings, like reference numerals are used to indicate like components.

Figure 3:
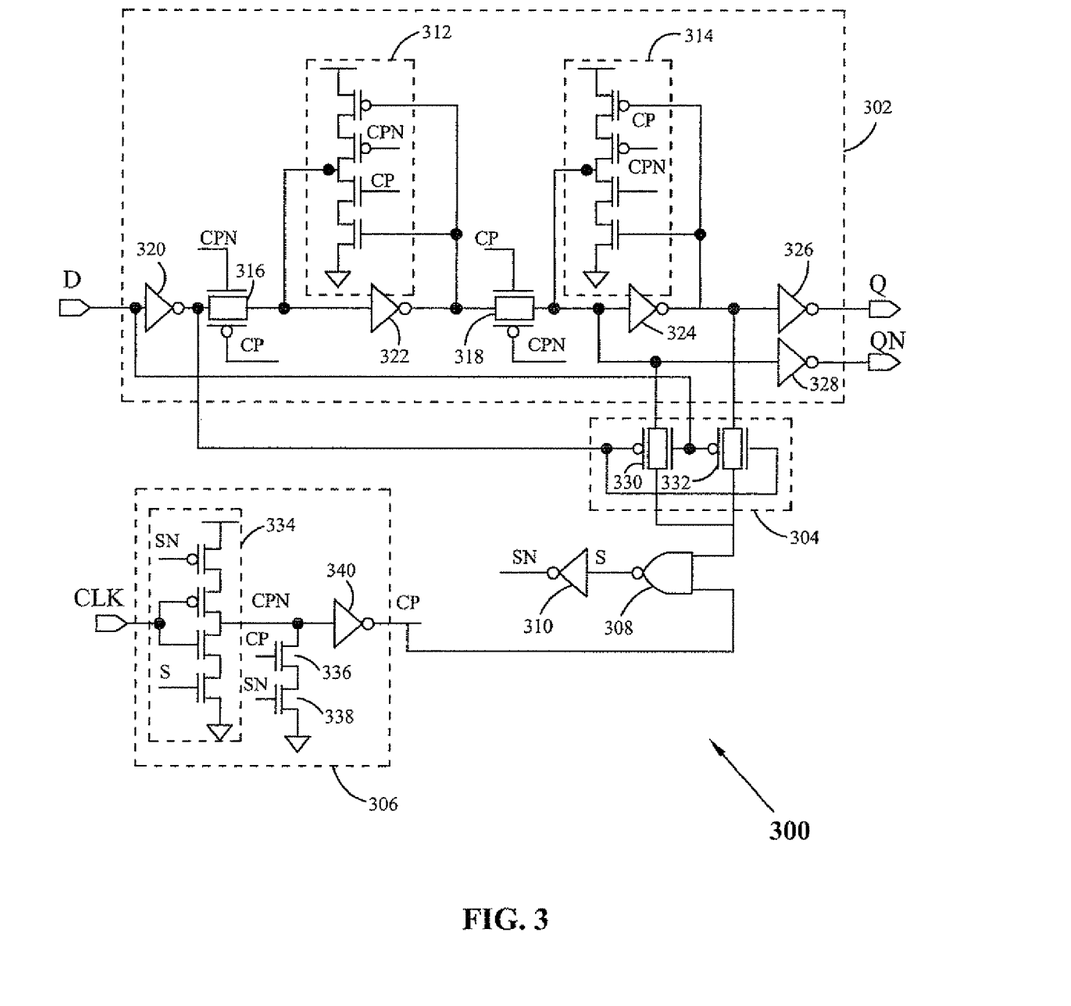
FIG. 3 is a circuit diagram of a flip-flop circuit, according to the present invention.

FIG. 3 illustrates a flip-flop circuit 300 according to an embodiment of the present invention. The flip-flop 300 utilizes low power and thus can be used for low electromagnetic interference (EMI) applications. The circuit 300 includes a flip-flop circuit 302, a sensing circuit 304, a clock generating circuit 306, a NAND gate 308 and an inverter 310. The flip-flop circuit 302 includes two tri-state inverters 312 and 314, two transmission gates 316 and 318 and inverters 320, 322, 324, 326 and 328. The tri-state inverter circuits 312 and 314 include a pair of PMOS transistors and a pair of NMOS transistors connected as shown in FIG. 3. In an embodiment, the transmission gates 316 and 318 include a PMOS transistor and an NMOS transistor. The sensing circuit 304 includes a first transmission gate 330 and a second transmission gate 332, having inputs coming from internal nodes (inverted D, D, nodes prior to Q and QN) and having a wired output. The clock generating circuit 306 includes a tri-state inverter 334, two serially connected NMOS pull down transistors 336 and 338, and an inverter 340.

In an embodiment the sensing circuit 304 is made to perform a XNOR operation, which gives logic 1 when D and Q are in same state and logic 0 when D and Q are in different state. The sensing circuit 304 is connected to the flip-flop circuit 302 for comparing the input signal with the output of the flip-flop circuit 302 to provide a comparison signal. This comparison signal is then fed to one of the inputs of the NAND gate 308 and the other input to the NAND gate 308 comes from an internal clock signal CP. The NAND gate 308 performs faster operations and is efficient compared to the gate 234. The signal CP is generated by the clock generating circuit 306. The NAND gate 308 prevents the generation of any false edge. The output of the NAND gate 308 provides signals S and SN. The signal S goes high if either CP is low or D and Q are different. The tri-state inverter 334 is controlled by signals S and SN and the tri-state inverter 334 is ON when the signal S is high, and the tri-state inverter 334 is OFF when the signal S is low. The two NMOS transistors 336 and 338 maintain the default state at the node CP.

When D and Q are in the same state and the signal CP is high (default state), the tri-state inverter 334 is OFF and the NMOS transistors 336 and 338 are ON, and, a node CPN is at a low state and the node CP is in high state. When D and Q are different, the signal CP takes the value of the clock CLK and follows it until the rising edge of the clock CLK, at which a new data value is transferred to output Q of the flip-flop and D and Q are the same again. The NAND gate 308 and the NMOS transistors 336 and 338 prevent a false rising edge.

FIG. 6 illustrates the internal clock signal of the flip-flop circuit 200 and the flip-flop circuit 300. The rising edge for the present invention is sharp and prefect and there is no slag in the rising edge.

Figure 7:
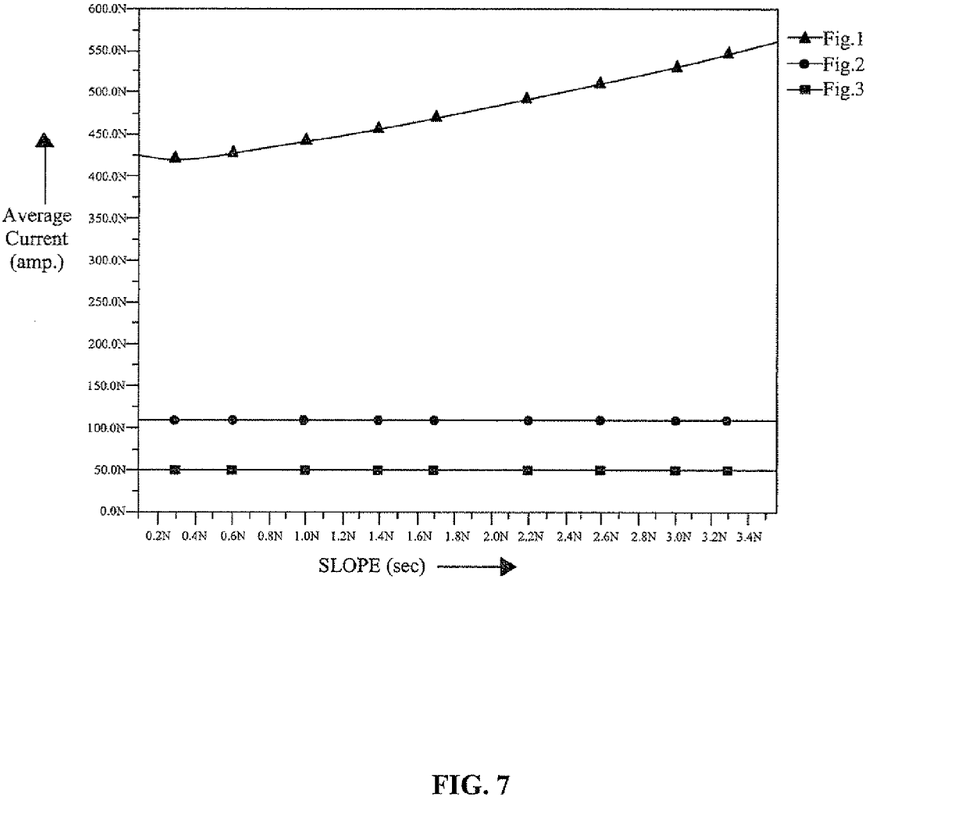
FIG. 7 is a graph describing an average current dissipation, when a data constant clock configuration toggles at different input clock slopes for different flip-flop structures as illustrated in FIG. 1, FIG. 2 and FIG. 3.
Figure 8:
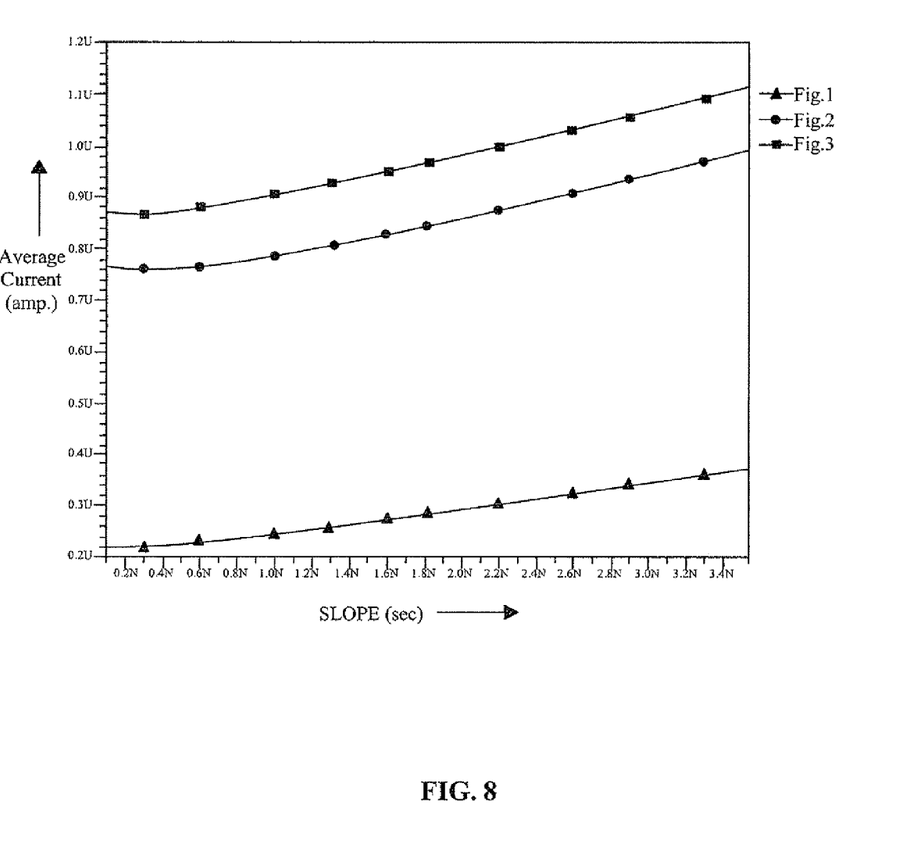
FIG. 8 is a graph describing an average current dissipation, when a clock constant data configuration toggles at different input data slopes for different flip-flop structures as illustrated in FIG. 1, FIG. 2 and FIG. 3.
Figure 9:
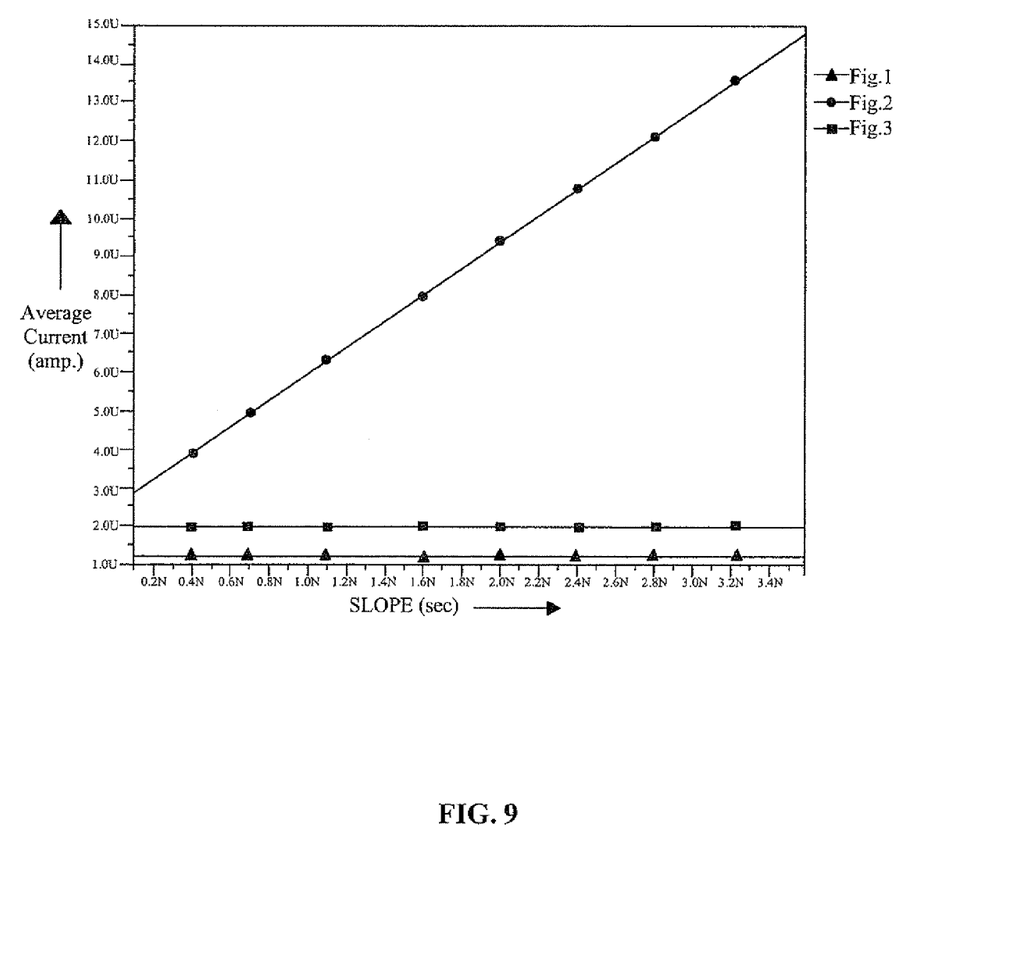
FIG. 9 is a graph describing an average current dissipation, when a clock change flip-flop output Q changes at different input clock slopes for different flip-flop structures as the clock changes as illustrated in FIG. 1, FIG. 2, and FIG. 3.

FIG. 7, FIG. 8, and FIG. 9 illustrate a detailed functionality of the flip-flop circuits 200 and 300 during different states. The states refers to state I—clock constant data toggle, state II—data constant clock toggle and state III—clock change flip-flop output (Q) change. As illustrated in FIG. 7, the power consumption under state II is lower for the flip-flop circuit 300 as compared to other conventional circuits. There is almost 50% less power consumption in the flip-flop circuit 300 as compared to the conventional flip-flop circuit 200. As illustrated in FIG. 9, the power consumption under the state III is less for the circuit 300 as compared to the conventional circuit 200.

Figure 10:
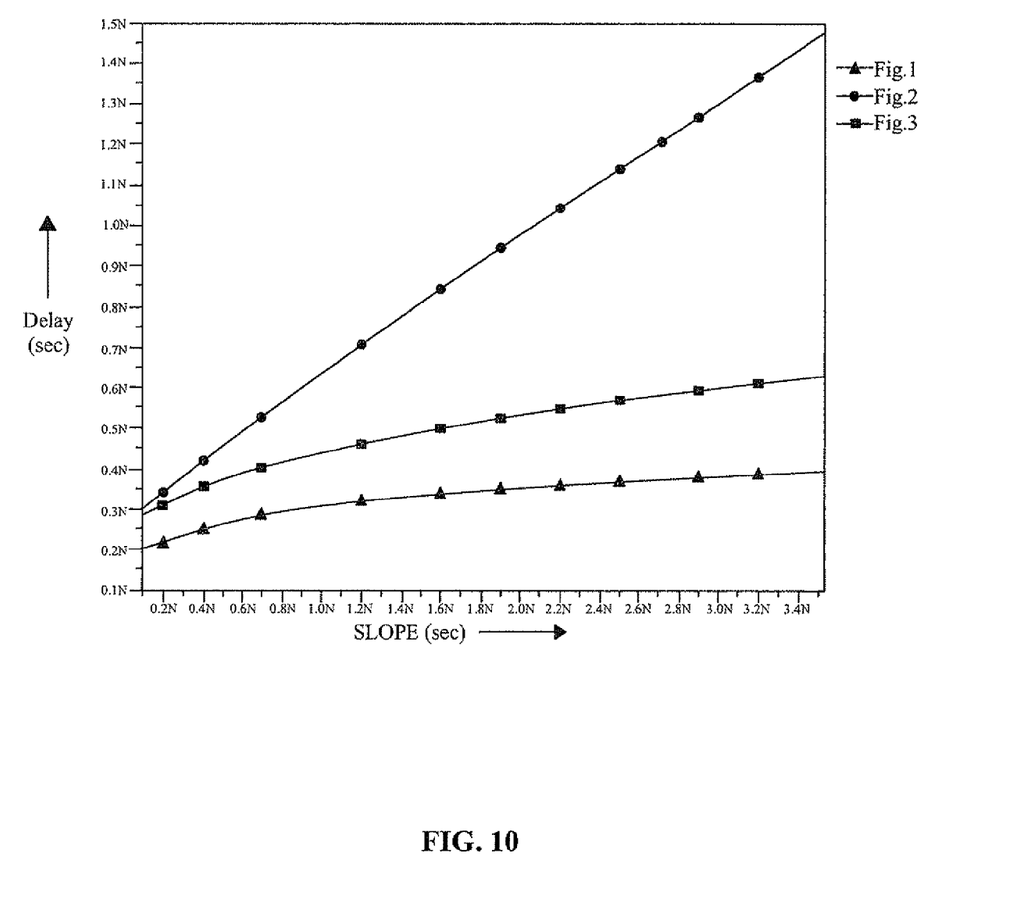
FIG. 10 is a graph describing the variations of the clock for an output delay with different input clock slopes for different flip-flop structures as illustrated in FIG. 1, FIG. 2 and FIG. 3.

FIG. 10 illustrates a graph describing the clock variations to output delay with different input clock slopes for different flip-flop structures as illustrated in FIG. 1, FIG. 2, and FIG. 3. As shown, the clock to output delay for the circuit 300 is lower, when compared with the conventional circuit.

Figure 11:
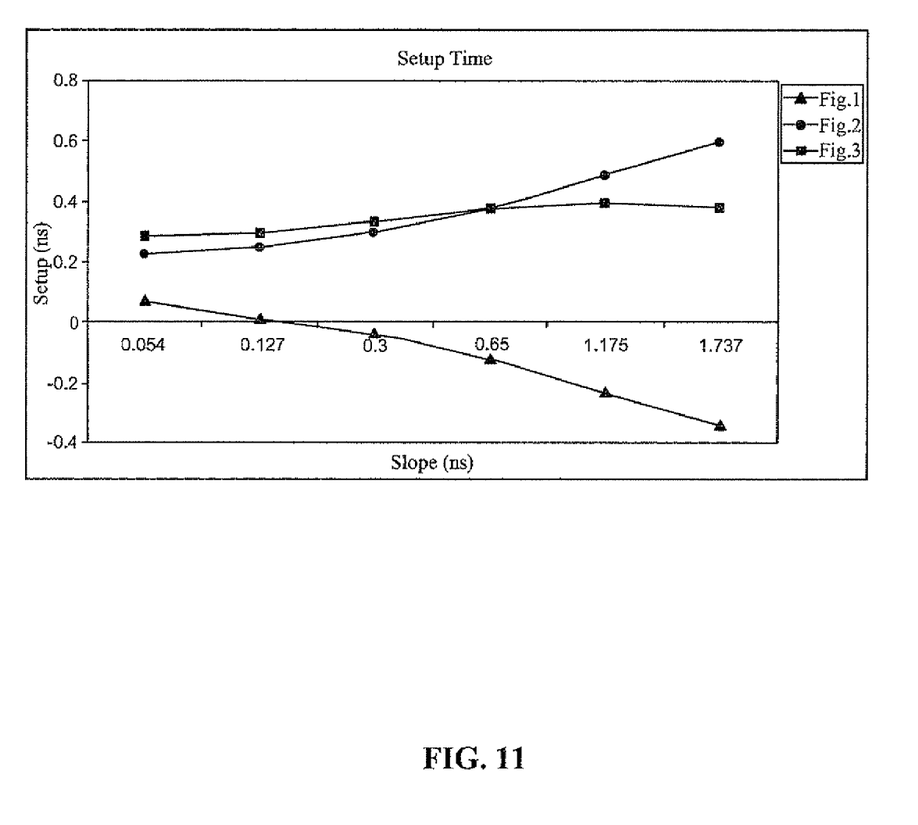
FIG. 11 is a graph describing the variation of a set-up time rise edge with different input clock slopes for different flip-flop structures as illustrated in FIG. 1, FIG. 2 and FIG. 3.
Figure 12:
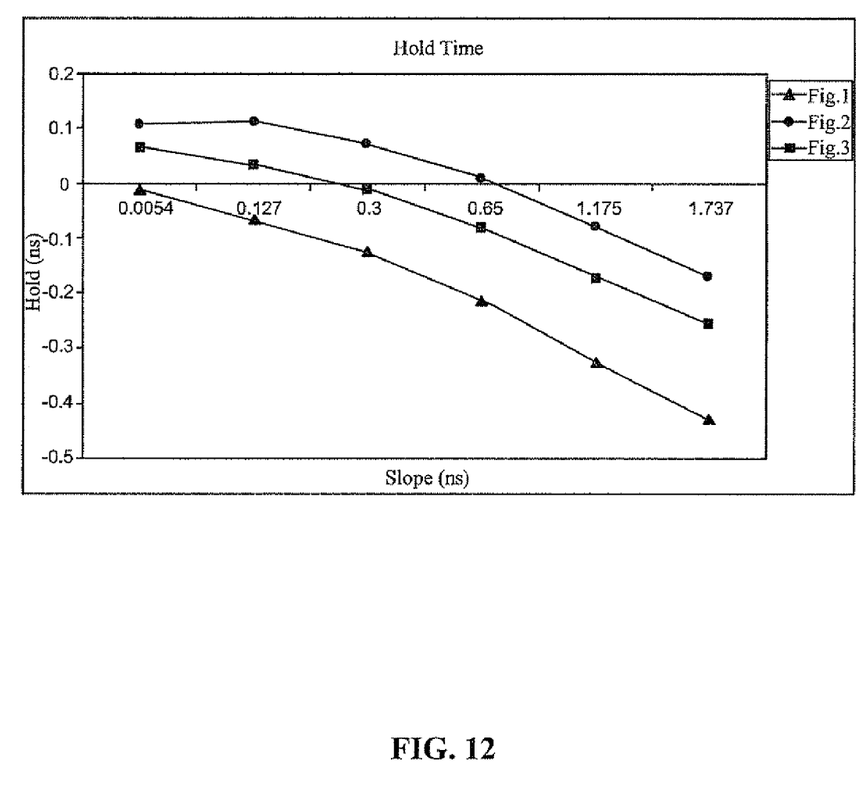
FIG. 12 is a graph describing the variation of a hold time with different input clock slopes for different flip-flop structures as illustrated in FIG. 1, FIG. 2 and FIG. 3.

FIG. 11 and FIG. 12 illustrate a graph describing the variation of the set-up time and the hold time with different input clock slopes for different flip-flop structure as illustrated in FIG. 1, FIG. 2, and FIG. 4.

Figure 13:
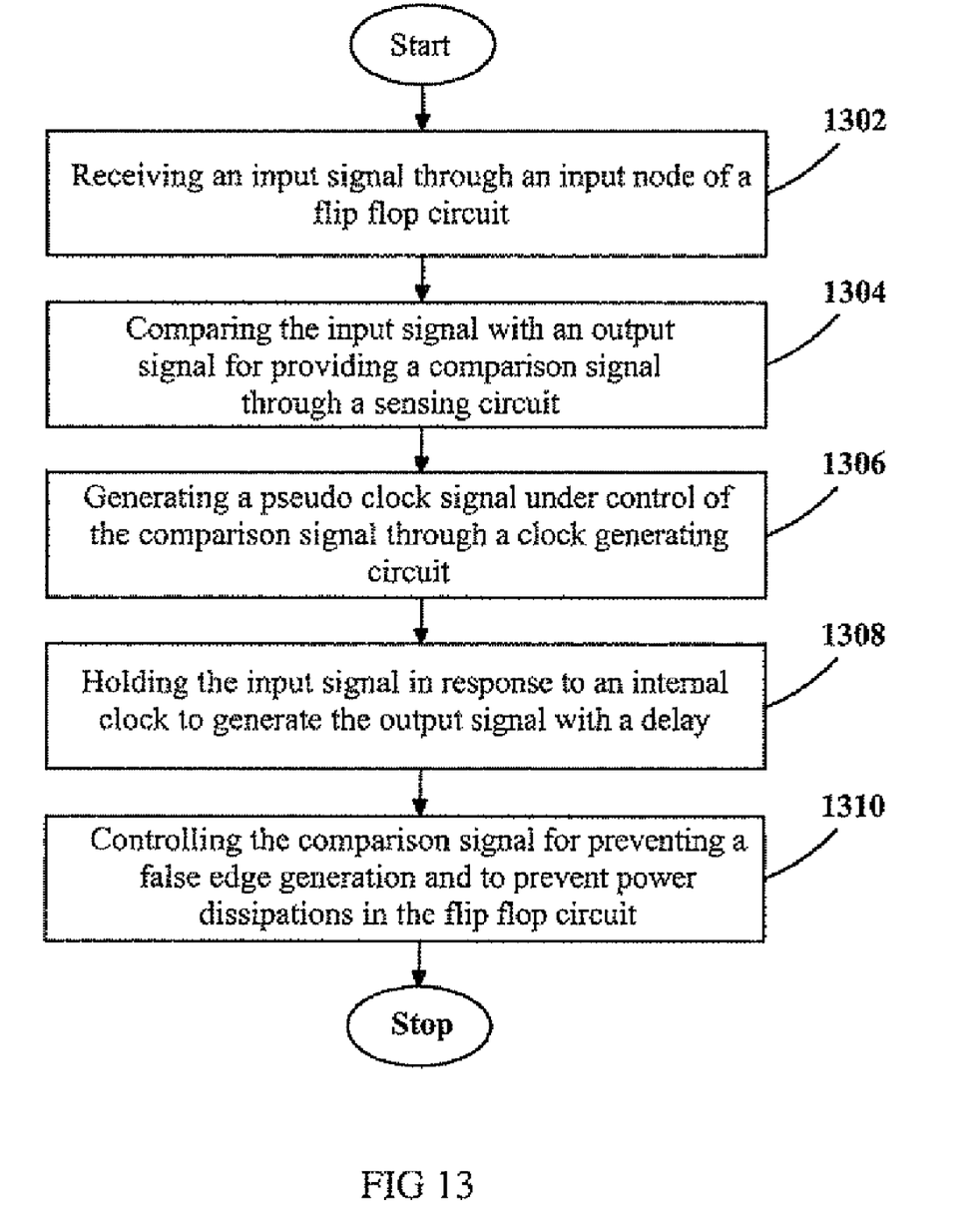
FIG. 13 is a flow diagram of a method for providing low power dissipations in a flip-flop circuit, in accordance with the present invention.

FIG. 13 illustrates a flow diagram of a method providing low power dissipation in a flip-flop circuit. At step 1302, an input signal is received through an input node of the flip-flop circuit. At step 1304, the input signal is compared with an output signal for providing a comparison signal through a sensing circuit. At step 1306, a pseudo clock signal under control of the comparison signal is generated through a clock generating circuit. At step 1308, the input signal is held in response to an internal clock to generate the output signal with a delay. At step 1310, the comparison signal is controlled for preventing a false edge generation and to prevent power consumption in the flip-flop circuit.

The present invention provides a low power flip-flop circuit that offers various advantages. First, the present invention provides a contention free structure. Second, the present flip-flop circuit is well suitable for low EMI applications. Third, the power consumption under a clock toggle data stable condition is reduced by almost 50%. Fourth, the power consumption in a clock rise Q change condition is reduced and is constant with a change in input clock slope. Fifth, the present invention provides a more robust structure with respect to process variations compared to the conventional structure. Sixth, the present structure consumes less area compared to the conventional structure. Seventh, a fixed capacitance is produced by the clock input compared to the varying clock capacitance in the conventional method. Eighth, the clock to Q delay is lower compared to the conventional circuit.

Although the disclosure of a circuit and a method has been described in connection with the present embodiment illustrated in the accompanying drawings, it is not limited thereto. It will be apparent to those skilled in the art that various substitutions, modifications and changes may be made thereto without departing from the scope and spirit of the disclosure.

That which is claimed:

1. A circuit comprising:
a flip-flop circuit to receive and hold an input signal;
a sensing circuit coupled to said flip-flop circuit to compare the input signal with an output signal of said flip-flop circuit to provide a comparison signal; and
a clock generating circuit to generate a pseudo clock signal to operate said flip-flop circuit based upon the comparison signal and an external clock signal;
said clock generating circuit comprising a tri-state latch circuit configured to receive the external clock signal, and to generate the pseudo clock signal based upon the comparison signal.

2. The circuit of claim 1, wherein said pseudo clock signal follows a leading edge of the external clock signal to reduce power consumption.

3. The circuit of claim 1, further comprising a NAND gate coupled to said sensing circuit and said clock generating circuit and to control the comparison signal to prevent a false edge generation.

4. The circuit of claim 1, wherein said sensing circuit comprises first and second transmission gates coupled in parallel to provide the comparison signal.

5. The circuit of claim 4, wherein the comparison signal is in a first state when the input signal and the output signal are in a same state.

6. The circuit of claim 4, wherein the comparison signal is in a second state when the input signal and the output signal are in a different state.

7. The circuit of claim 1, wherein said clock generating circuit comprises a tri-state latch circuit to receive the external clock signal and to generate the pseudo clock signal under control of the comparison signal.

8. The circuit of claim 7, wherein said clock generating circuit further comprises a pair of NMOS transistors coupled in series to maintain the pseudo clock signal to prevent a false edge generation and an inverter circuit to invert the pseudo clock signal.

9. The circuit of claim 7, wherein said tri-state latch circuit is turned on when the comparison signal is in a first state.

10. The circuit of claim 9, wherein said tri-state latch circuit is turned off when the comparison signal is in a second state.

11. A circuit comprising:
a flip-flop circuit to receive and hold an input signal;
a sensing circuit coupled to said flip-flop circuit and to compare the input signal with an output signal of said flip-flop circuit to provide a comparison signal, said sensing circuit comprising first and second transmission gates coupled in parallel to provide the comparison signal; and
a clock generating circuit to generate a pseudo clock signal based upon the comparison signal and an external clock signal;
said clock generating circuit comprising a tri-state latch circuit configured to receive the external clock signal, and to generate the pseudo clock signal based upon the comparison signal.

12. The circuit of claim 11, further comprising a NAND gate coupled to said sensing circuit and said clock generating circuit and to control the comparison signal to prevent a false edge generation.

13. The circuit of claim 11, wherein the pseudo clock signal follows a positive edge of the external clock signal to reduce power dissipation.

14. The circuit of claim 11, wherein the comparison signal is in a first state when the input signal and the output signal are in a same state.

15. The circuit of claim 14, wherein the comparison signal is in a second state when the input signal and the output signal are in a different state.

16. The circuit of claim 11, wherein said clock generating circuit further comprises a pair of NMOS transistors coupled in series to maintain the pseudo clock signal and to prevent a false edge generation and an inverter circuit to invert the pseudo clock signal.

17. The circuit of claim 11, wherein said tri-state latch circuit is turned on when the comparison signal is in a first state.

18. The circuit of claim 11, wherein said tri-state latch circuit is turned off when the comparison signal is in a second state.

19. A method of operating a flip-flop circuit comprising:
receiving an input signal through an input node of the flip-flop circuit and holding the input signal;
comparing, through a sensing circuit, the input signal with an output signal of the flip-flop circuit to provide a comparison signal; and
generating, through a clock generating circuit, a pseudo clock signal based upon the comparison signal and an external clock signal, the pseudo clock signal for operating the flip-flop circuit;
the clock generating circuit comprising a tri-state latch circuit configured to receive the external clock signal, and to generate the pseudo clock signal based upon the comparison signal.

20. The method of claim 19, further comprising controlling the comparison signal to prevent a false edge generation and to reduce power dissipation in the flip-flop circuit.

21. The method of claim 19, wherein the input signal is held in response to the pseudo clock signal to generate the output signal of the flip-flop circuit with a delay.

22. The method of claim 19, further comprising using a NAND gate coupled to the sensing circuit and the clock generating circuit, to control the comparison signal and to prevent a false edge generation.

23. The method of claim 19, wherein the sensing circuit comprises a first transmission gate coupled in parallel with a second transmission gate to provide the comparison signal.

24. The circuit of claim 23, wherein the comparison signal is in a first state when the input signal and the output signal are in a same state.

25. The circuit of claim 24, wherein the comparison signal is in a second state when the input signal and the output signal are in a different state.

* * * * *